(12) United States Patent
Charpentier et al.

(10) Patent No.: US 7,480,846 B2
(45) Date of Patent: Jan. 20, 2009

(54) ITERATIVE TURBO DECODER WITH SINGLE MEMORY

(75) Inventors: Sébastien Charpentier, Mougins (FR); Patrick Valdenaire, Roquefort (FR)

(73) Assignee: ST Wireless SA, Geneve (CH)

( * ) Notice: Subject to any disclaimer, the term of this patent is extended or adjusted under 35 U.S.C. 154(b) by 389 days.

(21) Appl. No.: 10/514,288

(22) PCT Filed: May 7, 2003

(86) PCT No.: PCT/IB03/01911

§ 371 (c)(1),
(2), (4) Date: Nov. 12, 2004

(87) PCT Pub. No.: WO03/098811

PCT Pub. Date: Nov. 27, 2003

(65) Prior Publication Data

US 2005/0180513 A1 Aug. 18, 2005

(30) Foreign Application Priority Data

May 17, 2002 (FR) .................................. 02 06079

(51) Int. Cl.
*H04L 13/00* (2006.01)
*G06F 5/00* (2006.01)

(52) U.S. Cl. .................... 714/755; 326/96; 327/202; 710/58; 714/752

(58) Field of Classification Search ............. 710/65–70; 714/752, 755, 786; 326/96; 327/202
See application file for complete search history.

(56) References Cited

U.S. PATENT DOCUMENTS

| | | | | |
|---|---|---|---|---|
| 5,448,715 A | * | 9/1995 | Lelm et al. .................. 713/600 |
| 5,774,410 A | * | 6/1998 | Nakase .................. 365/230.05 |
| 5,867,694 A | * | 2/1999 | Billings et al. .............. 713/501 |
| 6,208,582 B1 | * | 3/2001 | Kanda et al. ................. 365/233 |
| 6,314,047 B1 | * | 11/2001 | Keay et al. ............. 365/230.05 |
| 6,518,810 B1 | * | 2/2003 | Takahashi .................... 327/202 |
| 6,662,331 B1 | * | 12/2003 | Kang ......................... 714/755 |
| 6,882,562 B2 | * | 4/2005 | Beucler ...................... 365/154 |
| 2003/0028843 A1 | * | 2/2003 | Chang et al. ................. 714/786 |

OTHER PUBLICATIONS

Mesare G et al, "VLSI Architecture for Turbo Codes", IEEE Transactions of Very Large Scale Integration (VLSI) Systems, IEEE Inc. New York, NY, vol. 7, No. 3 Sep. 1999, pp. 369-379.*
"VLSI Architectures for Turbo Codes", by Masera, G. et al., IEEE Transactions on very Large Scale Integration, vol. 7, No. 3, Sep. 1999.

* cited by examiner

*Primary Examiner*—Tariq Hafiz
*Assistant Examiner*—Jonathan R Plante
(74) *Attorney, Agent, or Firm*—Lisa K. Jorgenson; William J. Kubida; Hogan & Hartson LLP (57) ABSTRACT

The invention relates to the domain of turbo decoders. Such a decoder comprises a first decoder (14) and a second decoder (16), each decoder being able to calculate extrinsic output data from extrinsic input data coming from the other decoder. The decoding circuit according to the invention comprises a single memory (31) for storing the extrinsic data. When a decoder calculates an extrinsic output data from an extrinsic input data coming from the other decoder and stored in the single memory at a certain address, this extrinsic output data is then written at this same address.

2 Claims, 5 Drawing Sheets

FIG.5

ITERATIVE TURBO DECODER WITH SINGLE MEMORY

FIELD OF THE INVENTION

The present invention relates to a decoding circuit for decoding input data in iterative manner, said circuit comprising at least a first decoder and a second decoder, each decoder being able to calculate extrinsic output data from input data and extrinsic input data coming from the other decoder.

The invention also relates to a decoding method for decoding data with such a decoding circuit.

The invention finally relates to a program comprising program code instructions for executing steps of this method.

The invention finds an application, for example, in a satellite communication system or in a system utilizing the UMTS standard. For example, a third-generation mobile telephone may utilize such a decoding circuit.

BACKGROUND OF THE INVENTION

Many communication systems utilize turbo codes to send data from a transmitter to a receiver. The data are coded by the transmitter by means of turbo codes and decoded in iterative fashion at the receiver end. A telecommunications network utilizing the UMTS standard is an example of such a system. Between the transmitter and the receiver the data are passing over a channel. This channel may produce noise which may generate errors in the data received by the receiver.

The use of turbo codes permits a proper error correction at the receiver end. Thus, such a communication system produces a relatively low error rate.

Figure 1:
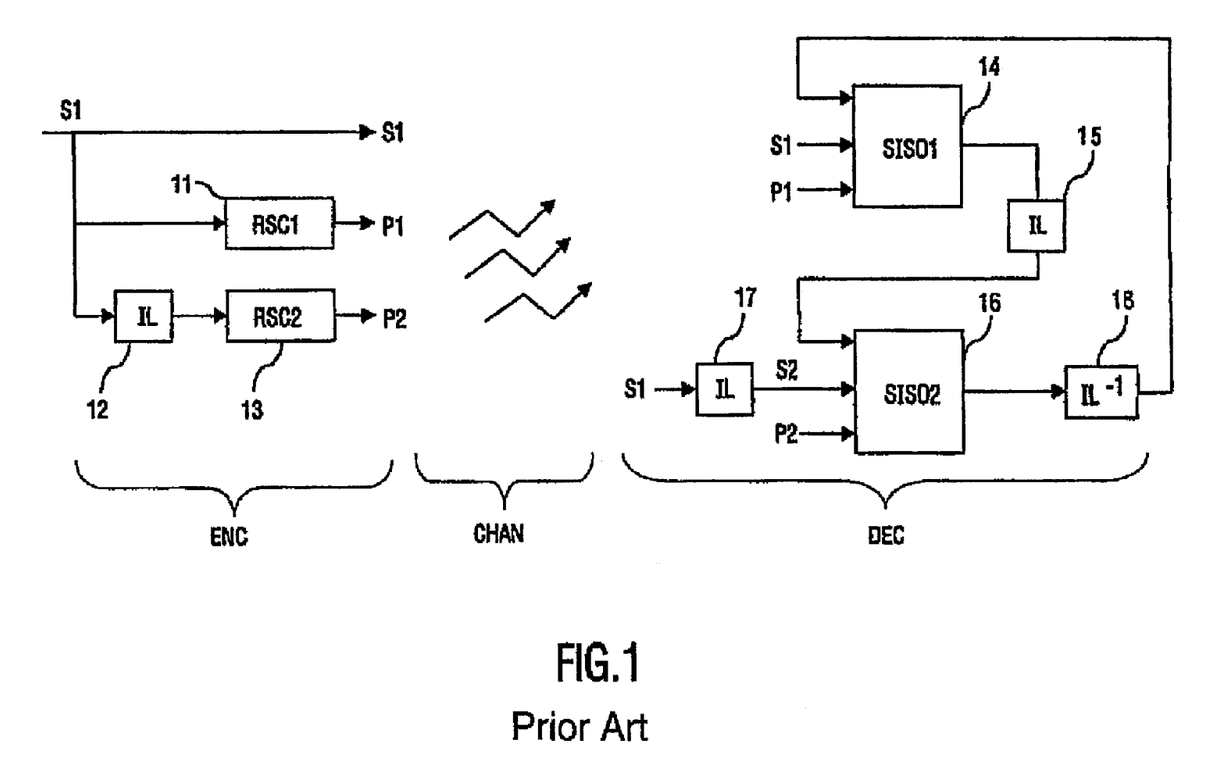
FIG. 1 is a basic circuit diagram of a prior-art communication system.

FIG. 1 represents an example of a communication system that utilizes turbo codes. Such a system comprises an encoding device ENC, a transmission channel CHAN and a decoding device DEC. At the level of the encoding device ENC a data vector S1 is coded by a first systematic recursive coder 11 to produce a first parity vector P1. In parallel, the data of the data vector S1 are interleaved by a first interleaver 12 and the vector which is the result thereof is coded by a second systematic recursive coder 13 to produce a second parity vector P2.

The data interleaving of a vector comprises permuting the components of this vector in a predefined order in order to obtain another vector. In the following the interleaving of data of a vector or the interleaving of the vector will be discussed indiscriminately in order to simplify the description.

Then the data vector S1, the first parity vector P1 and the second parity vector P2 are sent over the transmission channel CHAN to the decoding device DEC.

The decoding device DEC comprises a first decoder 14, a second decoder 16, a second interleaver 15, a third interleaver 17 and a de-interleaver 18. In the example of FIG. 1 the decoders 14 and 16 are soft-input-soft-output (SISO) decoders.

This decoding device DEC operates in iterative manner. During an iteration the first decoder 14 calculates a first extrinsic output data vector from the received data vector S1, the first received parity vector P1 and an extrinsic data vector coming from the second decoder 16. If there is not yet an extrinsic data vector coming from the second decoder 16, it is replaced by a predefined vector, for example, a unit vector. This is possible when a decoding is iterated for the first time.

The first extrinsic output data vector is interleaved by means of the second interleaver 15, and the vector resulting therefrom is sent to the second decoder 16. The second decoder 16 then calculates a second extrinsic output data vector from the second parity vector P2, a vector S2 coming from the third interleaver 17 having for its input the data vector S1, and the vector coming from the second interleaver 15. The second extrinsic output data vector is then de-interleaved by the de-interleaver 18 and the resulting vector is sent to the first decoder 14. A new iteration may then be effected.

Figure 2:
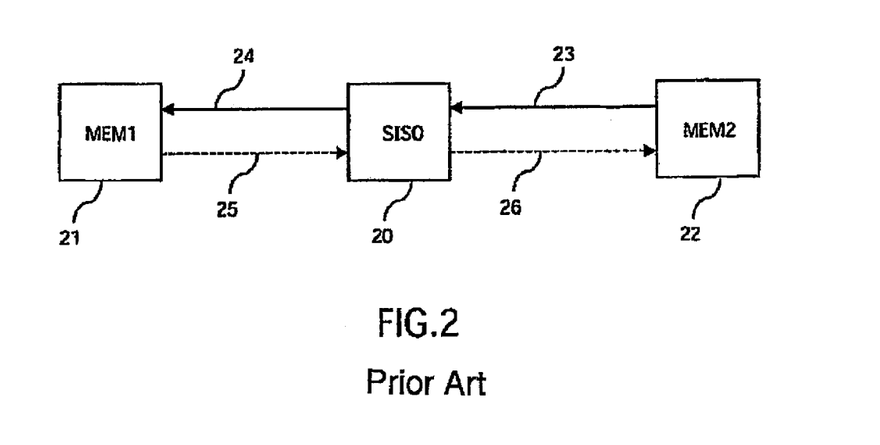
FIG. 2 is a block diagram illustrating characteristic features of a decoding device of FIG. 1.

FIG. 2 represents an example of the architecture permitting to implement the decoding device DEC. The decoding device DEC comprises a decoder 20, a first memory 21 and a second memory 22.

The decoder 20 alternately plays the role of first decoder 14 and second decoder 16. The decoder 20 thus operates in two modes:
 a SISO1 mode in which the decoder 20 acts as the first decoder 14 of FIG. 1,
 a SISO2 mode in which the decoder 20 acts as the second decoder 16 of the FIG. 1.

During an iteration the decoder 20 in the SISO1 mode processes input vectors as this has been described in detail in FIG. 1, and calculates a first extrinsic output data vector. The decoder 20 then goes to the SISO2 mode, processes input vectors and calculates a second extrinsic output data vector. The decoder 20 thus needs to read extrinsic data from and write extrinsic data in a memory. The extrinsic data are stored in the first and second memories 21 and 22.

When the decoder 20 is in the SISO1 mode it effects a de-interleaved reading 23 of the extrinsic data vector stored in the second memory 22. It then calculates the first extrinsic output data vector and performs a linearly writing 24 of this first extrinsic output data vector in the first memory 21. Then the decoder 20 changes to the SISO2 mode.

When the decoder 20 is in the SISO2 mode, it carries out an interleaved reading 25 of the extrinsic data vector stored in the first memory 21. It then calculates the second extrinsic output data vector and performs a linearly writing 26 of this second extrinsic output data vector in the second memory 22.

The de-interleaved reading 23 and the interleaved reading 25 are performed by a de-interleaver and an interleaver respectively, not shown in FIG. 2.

A drawback of this decoding system resides in the fact that two memories are necessary for storing the extrinsic data vectors. In the turbo decoders used, for example, in the UMTS standard, an extrinsic data vector contains 5114 bits of data. In consequence, the set of memories necessary for storing the extrinsic data has a considerable size, which is cumbersome because this requires a considerable silicon surface in a circuit accommodating such a turbo decoder.

This set of memories constitutes an extrinsic data memory system.

SUMMARY OF THE INVENTION

It is an object of the invention to propose a decoding circuit in which the size of the extrinsic data memory system is reduced.

A processing system according to the invention and as defined in the opening paragraph is characterized in that it comprises a single memory for storing the extrinsic data at certain addresses, an extrinsic output data calculated by a decoder from an extrinsic input data coming from the other decoder being stored at the address of said extrinsic input data, the first decoder reading the extrinsic data in a first order from the single memory, the second decoder reading the extrinsic data in a second order from the single memory.

According to the invention it is possible to use a single memory for storing the extrinsic data vectors. Actually, the vectors of extrinsic data are stored in the single memory in the first order, for example, a linear order. This means that the first component of an extrinsic data vector is stored at the first address of the single memory, the second component at the second address and so on.

When the first decoder reads an extrinsic input data vector in the single memory, it does so in linear fashion which is to say that it reads the first component, then the second and so on and so forth. When the first decoder has calculated the component of the extrinsic output data vector that corresponds to the first component of the input data vector, it writes this component of the extrinsic output data vector at the address where the first component of the input data vector was stored, that is to say, the first address of the single memory.

When the second decoder reads an extrinsic input data vector in the single memory, it does so in interleaved fashion which means that it reads the components in a predefined interleaved order. When the second decoder has calculated the component of the extrinsic output data vector that corresponds to a component of the extrinsic input data vector, it writes this component of the extrinsic output data vector at the address where the corresponding component of the extrinsic input data vector was stored.

According to another, non-limiting embodiment of the invention the first and second decoders are produced by a sole decoder which alternately operates in a first mode corresponding to the operation of the first decoder and in a second mode corresponding to the operation of the second decoder. According to this embodiment only one decoder is necessary, which reduces the size of the decoding circuit.

The single memory preferably comprises a read port and a write port. This enables a decoder to simultaneously read and write a data in the single memory, which permits to reduce the decoding time.

Advantageously, the single memory is controlled by a frequency clock two times faster than a control frequency clock of the decoders. Even when the single memory has a sole port, this permits the decoders to read a data from and write a data in the single memory during one control clock cycle of the decoders. Thus, the decoding time is no longer than that necessary in a prior-art decoding circuit.

Preferably, the decoding circuit further comprises a register for temporarily storing a component of an extrinsic input data vector during a control clock cycle of the decoders. Thus the decoders, for reading an extrinsic data from the single memory, have a time equal to the time they had the disposal of in the prior art. This permits to utilize the invention with prior-art decoders without having to reprogram them.

BRIEF DESCRIPTION OF THE DRAWINGS

These and other aspects of the invention are apparent from and will be elucidated, by way of non-limitative example, with reference to the embodiment(s) described hereinafter.

In the drawings.

DESCRIPTION OF PREFERRED EMBODIMENTS

Figure 3A:
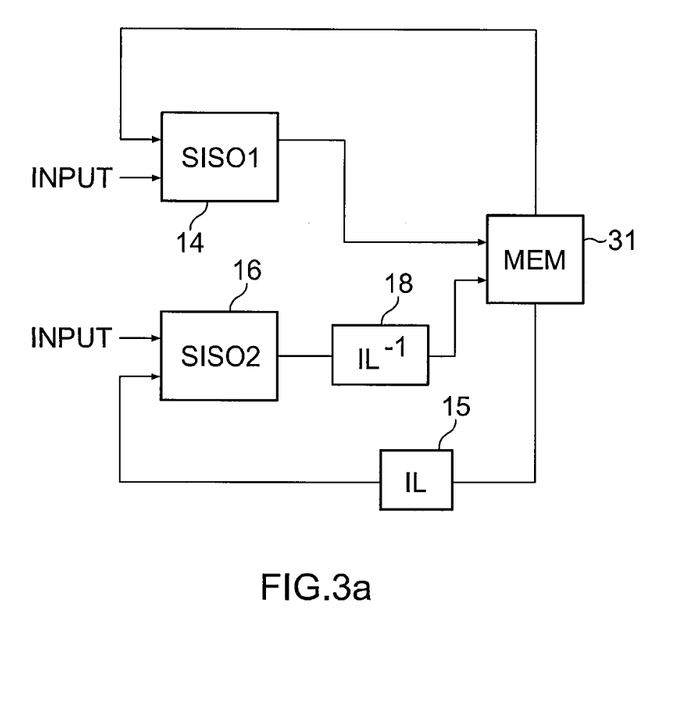
FIG. 3a is a block diagram illustrating characteristic features of an embodiment of the invention.

FIG. 3a illustrates a decoding circuit according to the invention. The circuit comprises a first decoder 14, a second decoder 16, a second interleaver 15, a first de-interleaver 18 and a single memory 31.

This circuit operates in iterative manner as will be explained hereinafter. An iteration comprises a first and a second half-iteration.

During the first half-iteration the first decoder 14 needs to read extrinsic data calculated by the second decoder 16 at the previous iteration in order to calculate an extrinsic output data vector. The single memory 31 comprises a vector whose components are the extrinsic data which the first decoder 14 is to read. Each component corresponds to a data to be decoded contained in a data vector S1 as will be shown in detail hereinafter.

Let us suppose that the data vector S1 comprises 10 components $S_{10}$ to $S_{19}$. This data vector S1 is written as: $S1 = [S_{10}S_{11}S_{12}S_{13}S_{14}S_{15}S_{16}S_{17}S_{18}S_{19}]$.

A parity vector P1 which is written as:
$P1 = [P_{10}P_{11}P_{12}P_{13}P_{14}P_{15}P_{16}P_{17}P_{18}P_{19}]$
corresponds to this data vector S1.

The extrinsic data vector calculated by the second decoder 16 during the preceding iteration is stored in the single memory 31 and is written as:
$La2 = [La_{20}La_{21}La_{22}La_{23}La_{24}La_{25}La_{26}La_{27}La_{28}La_{29}]$.

In the present case the single memory 31 comprises 10 addresses @0 to @9. The component $La_{20}$ is stored at the address @0, the component $La_{21}$ is stored at the address @1 and so on. The component $La_{20}$ is the extrinsic data corresponding to the data $S_{10}$, the component $La_{21}$ is the extrinsic data corresponding to the data $S_{11}$, and so on.

The calculation of the extrinsic output data corresponding to each component of the data vector S1 is made in the following fashion. The first decoder 14 reads each component of the extrinsic data vector La2 one by one and calculates for each component of the vector La2 a value $\alpha$ that depends on the corresponding components of the vectors S1 and P1 in accordance with a first function $f_1$. For example, the first decoder 14 calculates the value $\alpha_{10} = f_1(La_{20}, S_{10}, P_{10})$. A vector $\alpha_1$ is thus obtained which is written as:
$\alpha 1 = [\alpha_{10}\alpha_{11}\alpha_{12}\alpha_{13}\alpha_{14}\alpha_{15}\alpha_{16}\alpha_{17}\alpha_{18}\alpha_{19}]$.

This vector $\alpha 1$ is stored in an additional memory which is not shown in FIG. 3a.

Then, the first decoder 14 calculates for each component of La2 a value $\beta$ depending on corresponding components of the vectors S1 and P1, in accordance with a second function $f_2$. Such a calculation is made in reverse order to the order in which the values $\alpha$ are calculated. To do this, the first decoder 14 commences by calculating the value $\beta_{19} = f_2(La_{29}, S_{19}, P_{19})$. Each time a value $\beta$ is calculated, the first decoder 14 calculates a value La depending on this value $\beta$ and on the corresponding value $\alpha$ in accordance with a third function $f_3$. The first decoder 14 thus calculates a value $La_{19} = f_3(\alpha_{19}, \beta_{19})$ and writes this data at the address @9 of the single memory 31. The first decoder then calculates a value $La_{18} = f_3(\alpha_{18}, \beta_{18})$ and writes this data at the address @8 of the single memory 31, and so on. In this way is obtained in the single memory 31 an extrinsic data vector La1 which is written as: $La1 = [La_{10}La_{11}La_{12}La_{13}La_{14}La_{15}La_{16}La_{17}La_{18}La_{19}]$.

The calculation of the extrinsic data is known to those skilled in the art. It is described, for example, in a thesis by S. A. Barbulescu entitled <<Iterative decoding of turbo codes and other concatenated codes, University of South Australia, PhD Dissertation>>, published in August 1995.

It should be observed that it is also possible to make use of a calculation technique called "sliding windows" also known to those skilled in the art. This technique comprises dividing the vectors into windows. In the example above, for example two windows may be considered, one comprising the first five components of the vectors, the other comprising the last five components. The calculation of the extrinsic data is made in the following manner.

The first decoder 14 first calculates the values $\alpha_{10}, \alpha_{11}, \alpha_{12}, \alpha_{13}$ and $\alpha_{14}$. It then calculates the value $\beta_{14}$ and the value $La_{14}$. It then writes the value $La_{14}$ at the address @4 of the single memory 31 and, simultaneously, reads the value $La_{25}$ from the address @5 of the single memory 31.

The single memory 31 is thus to comprise means for writing and simultaneously reading data in or from different addresses. Preferably the single memory 31 comprises a read port and a write port. A read port is understood to mean a port suitable for reading data, which does not exclude that data are also written in this port. Similarly, a write port is understood to mean a port suitable for writing data, which does not exclude that data are also read through this port. Another means of writing and simultaneously reading data will be described below and illustrated in FIGS. 4 and 5.

During the second half-iteration the second decoder 16 is to read from the single memory 31 the components of the extrinsic data vector La1. Such a reading takes place in interleaved fashion by means of the second interleaver 15 in a predefined interleave order. For example, the second decoder 16 may successively read the components $La_{12}, La_{19}, La_{11}, La_{15}, La_{14}, La_{18}, La_{10}, La_{17}, La_{13}$ and $La_{16}$. By means of a vector S2 that corresponds to the vector S1 interleaved by a third interleaver 17 not shown in FIG. 3a, and of a second parity vector P2 corresponding to the first interleaved parity vector, the second decoder 16 calculates the values $\alpha_{22}, \alpha_{29}, \alpha_{21}, \alpha_{25}, \alpha_{24}, \alpha_{28}, \alpha_{20}, \alpha_{27}, \alpha_{23}$ and $\alpha_{26}$ in the same manner as that described above. For example, $\alpha_{22}=f_1(La_{12}, S_{22}, P_{22})$.

The second decoder 16 then calculates a value $\beta_{26}=f_2(La_{16}, S_{26}, P_{26})$ and a value $La'_{26}=f_3(\alpha_{26}, \beta_{26})$, which is the extrinsic output data corresponding to the data $S_{16}$. The second decoder 16 then writes this value $La'_{26}$ in the single memory 31 at the address at which the extrinsic data $La_{16}$ was located, that is to say, at the address @6. This is done by means of the de-interleaver 18. This is possible because once the second decoder 16 has calculated the value $La'_{26}$ it no longer needs to have the corresponding extrinsic input data $La_{16}$ and can thus use the address @6 of the single memory 31 for writing therein the value $La'_{26}$.

The second decoder 16 then calculates a value $\beta_{23}=f_{13}, S_{23}, P_{23}$) and a value $La'_{23}=f_3(\alpha_{23}, \beta_{23})$, and writes this value at the address @3, and so on. One thus obtains in the single memory 31 an extrinsic data vector La'2 which is written as:
$La'2=[La'_{20}La'_{21}La'_{22}La'_{23}La'_{24}La'_{25}La'_{26}La'_{27}La'_{28}La'_{29}]$.

This vector La'2 of extrinsic data may then be used by the first decoder 14 at the next iteration.

It is also possible to use the 'sliding windows' technique for the second decoder 16.

It should be noted that by virtue of the invention the extrinsic output data calculated by the first decoder 14 and by the second decoder 16 are always stored in the single memory 31 in a linear fashion. After a predefined number of iterations, the decoding is stopped and the extrinsic data are read by a final circuit which is not shown in FIG. 3a. In consequence, if the decoding is stopped after the first decoder has calculated its extrinsic output data, a simple linear reading permits the final circuit to read these extrinsic data. This similarly holds if the decoding is stopped after the second decoder has calculated its extrinsic output data. The final circuit thus does not need to perform de-interleaved reading.

This offers an advantage over the prior art. Actually, in the prior art, if the decoding is stopped after the second decoder has calculated its extrinsic output data, the final circuit is to carry out a de-interleaved reading from the second memory of the FIG. 2. This asks for an additional de-interleaver which has a drawback notably at the level of the power consumption of the decoding circuit.

It should also be noted that the invention is not restricted to extrinsic data vectors stored in linear fashion in the single memory 31. It may be considered, for example, to store the extrinsic data vectors in interleaved fashion. In this case the first decoder 14 is to read from the single memory 31 in de-interleaved fashion and the second decoder 16 is to read from the single memory 31 in linear fashion.

Figure 3B:
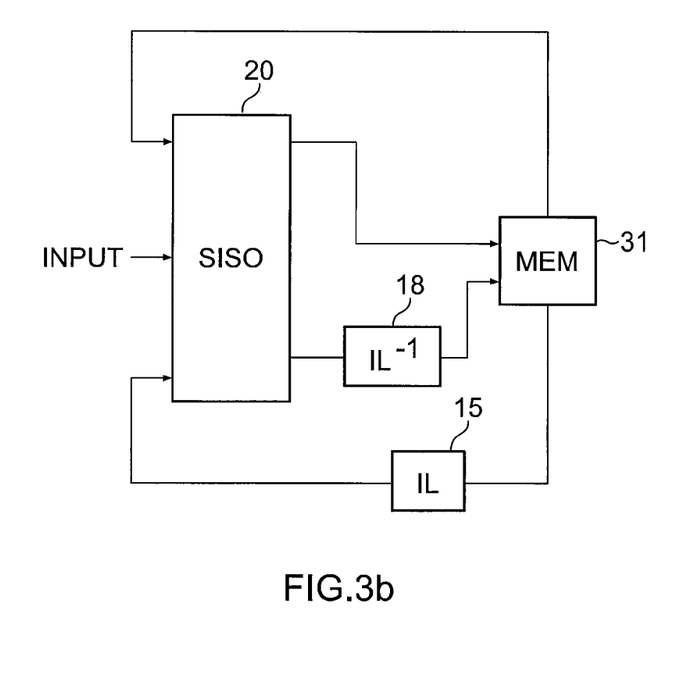
FIG. 3b is a block diagram illustrating characteristic features of another embodiment of the invention.

FIG. 3b represents a decoding circuit comprising a sole decoder 20. This decoder alternately plays the role of first decoder 14 and of second decoder 16 of FIG. 3a.

The use of the 'sliding windows' technique requires to be able to simultaneously read a data from and write a data in the single memory 31. When the single memory 31 has only one port, this is possible by controlling the single memory 31 by a clock whose frequency is double the clock frequency controlling the decoder 20.

Figure 4:
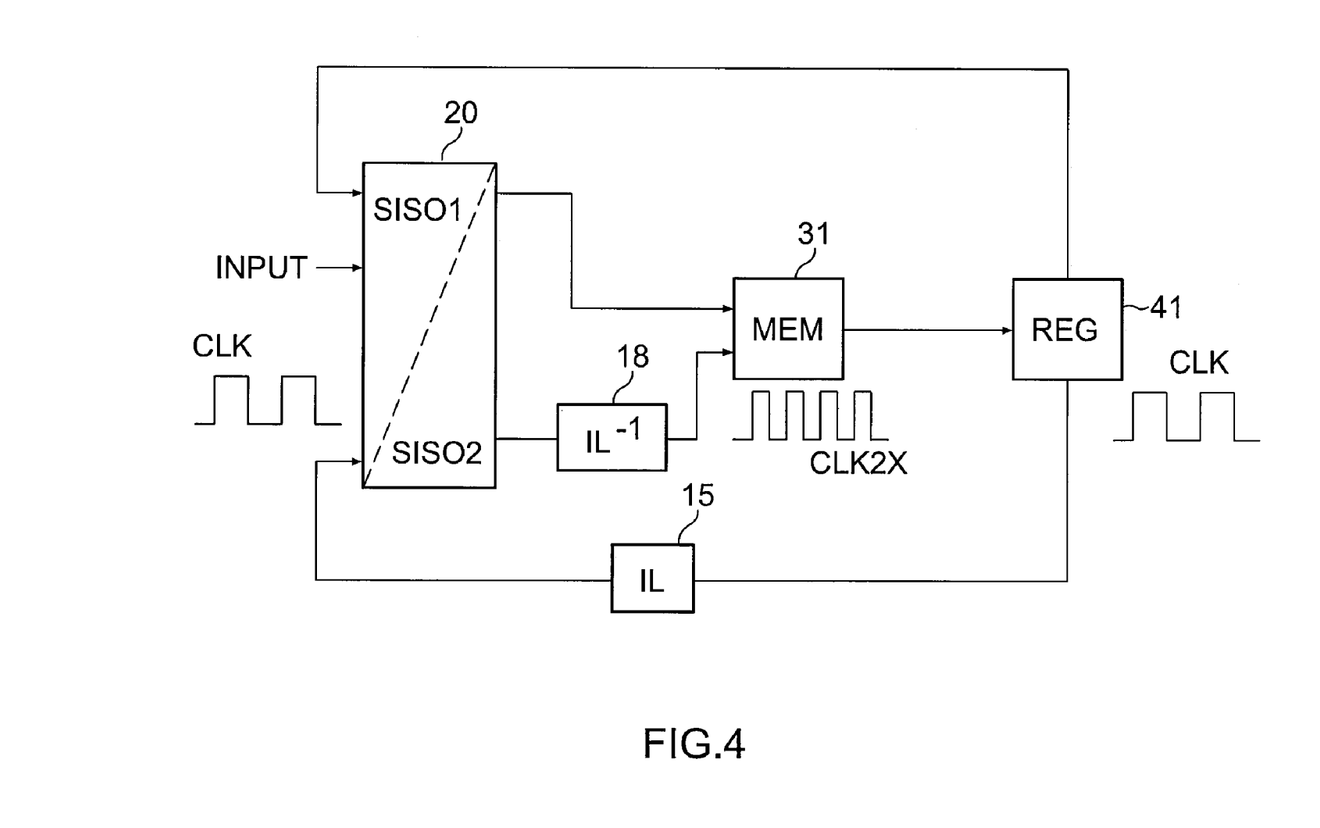
FIG. 4 is a block diagram illustrating characteristic features of another advantageous embodiment of the invention.

FIG. 4 illustrates such a decoding circuit. The decoder 20 is controlled by a first clock CLK which has a frequency f. The single memory 31 is controlled by a second clock CLK2x which has a frequency two times f.

In a cycle of the second clock CLK2x, the single memory 31 can read or write a data. In consequence, in two cycles of the second clock CLK2x, the single memory 31 can read a data and then write another data or vice versa. Two cycles of the second clock CLK2x correspond to one cycle of the first clock CLK. Consequently, in a cycle of the first clock CLK, the single memory 31 can read and write two different data. This means that in one cycle of the first clock CLK the decoder 20 can read and write two data from and at different addresses in the single memory 31. Thus the decoder 20 can easily implement the sliding windows technique because this technique makes it necessary to read and write two different data in a single clock cycle controlling the decoder 20, that is to say, the first clock CLK in the present case.

Figure 5:
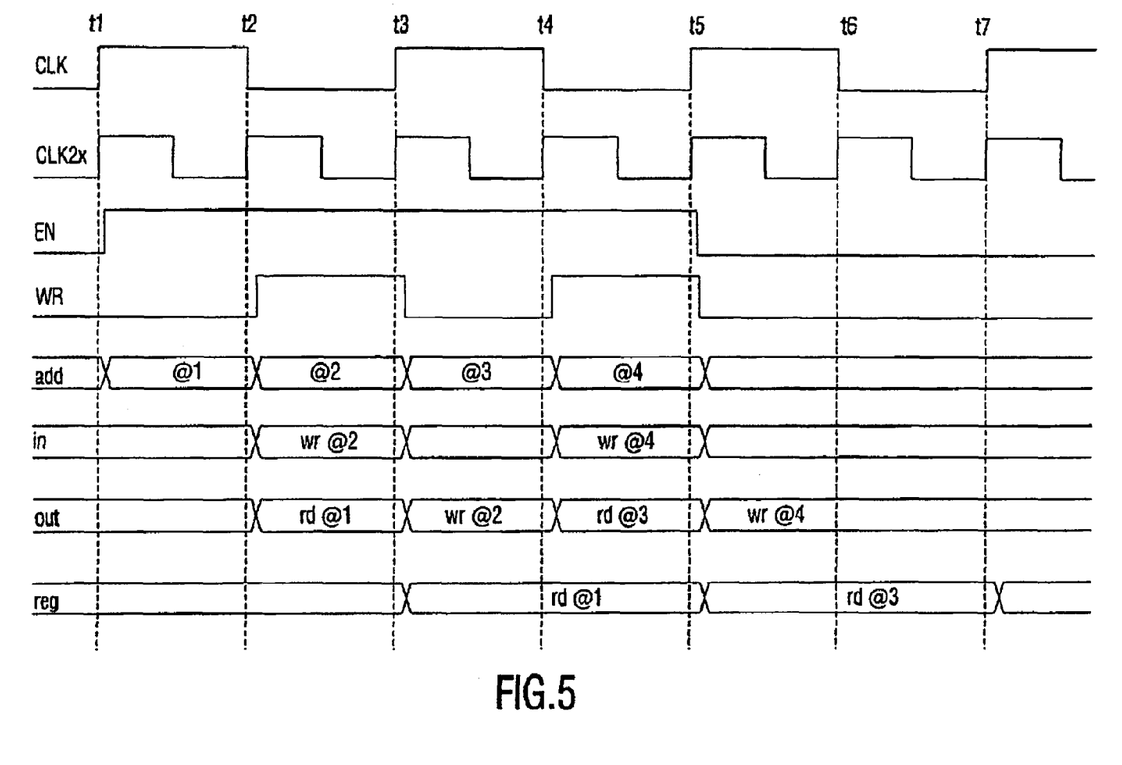
FIG. 5 is a timing diagram illustrating an operation of the decoding device of FIG. 4.

However, as will be seen in FIG. 5, an output data of the single memory 31 is in this case valid for only one cycle of the second clock CLK2x, that is to say, half a cycle of the first clock CLK. Consequently, in order to utilize the decoding circuit described above, it is necessary to reprogram the decoder 20 so that it is able to read data during only half a cycle of its control clock.

In order to mitigate this drawback, the decoding circuit preferably comprises a register 41 controlled by the first clock CLK. When a data leaves the single memory 31 it is locked in this register and remains valid for one cycle of the first clock CLK. The decoder 20 can thus read this data during a cycle of the first clock CLK. Consequently, it is not necessary to reprogram the decoder 20. This variant of the third embodiment of the invention can thus be used with a prior-art decoder.

FIG. 5 is a timing diagram which makes it possible to understand the operation of the decoding circuit of FIG. 4. This timing diagram comprises the first clock CLK, the second clock CLK2x, an enable signal EN making it possible to activate the port of the single memory 31, a write signal WR, an address signal add, an input signal in, an output signal out and a register signal reg.

The port of the memory 31 has an enable input which receives the enable signal EN, a read/write input which receives the write signal WR, an address input which receives the address signal add, an input port whose value is the input signal in and an output port whose value is the output signal out.

The first clock signal CLK has rising and falling edges at instants t1 to t7, instant t1 corresponding to a rising edge.

Just after instant t1, the signal EN adopts the value 1, the signal WR the value 0 and the signal add the value @1. This means that the decoder 20 wishes to read the data situated at the address @1 in the single memory 31. Consequently, at the next rising edge of the clock controlling the single memory 31, that is to say, the second clock CLK2$x$, the data situated at the address @1 is led to the output port of the single memory 31. This happens just after instant t2 (out=rd@1).

This data of the output port of the single memory 31 remains valid until the next rising edge of the second clock CLK2$x$, that is to say until instant t3. Consequently, this data is only valid during half a cycle of the first clock CLK. To render this data valid during an entire cycle of the first clock CLK, this data is locked in the register 41 at instant t3. To produce this, a register 41 is used which copies the value of the output port of the single memory 31 with each rising edge of the clock controlling it, that is to say, the first clock CLK in the case at hand. Thus, at instant t3, the register copies the value of the output port of the single memory 31 (reg=rd@1) and keeps this value until the next cycle of the first clock CLK. This value thus remains valid during a cycle of the first clock CLK, between instants t3 and t5. During this cycle of the first clock CLK, the decoder 20 can read this data. Consequently, for the decoder 20, everything takes place as if the single memory 31 were controlled by the first clock CLK.

Between instant t2 and instant t3, the write signal WR adopts the value 1 and the signal add adopts the value @2. This means that a data is to be written at the address @2 of the single memory 31. This data, denoted wr@2 is led to the input port of the single memory 31 between instant t2 and instant t3 (in=wr@2).

Just after instant t3 the data wr@2 is written at the address @2 of the single memory 31. It will be noted that the output port thus adopts this value wr@2 (out=wr@2).

Between instant t3 and instant t4 the write signal WR adopts the value 0 and the signal add the value @3. This means that the decoder 20 will read the data situated at the address @3 in the single memory 31. Consequently, at the next rising edge of the second clock CLK2$x$, the data situated at the address @3 is led to the output port of the single memory 31. This happens just after instant t4 (out=rd@3).

Between instant t4 and instant t5 the write signal wr adopts the value 1 and the signal add adopts the value @4. This means that a data is to be written at the address @4 of the single memory 31. This data, denoted wr@4 is led to the input port of the single memory 31 between instant t4 and instant t5 (in=wr@4).

Just after instant t5, the data wr@4 is written at the address @4 of the single memory 31. It will be noted that the output port thus adopts this value wr@4 (out=wr@4).

It should be noted that it is important to start reading from the single memory 31 when the clock controlling the register 41 is in the high state and writing when the clock controlling the register 41 is in the low state. Actually, by starting the reading when the clock controlling the register 41 is in the high state, the data to be read is valid on the output port when the clock controlling the register 41 is in the low state and when this clock has a rising edge. It is thus possible to lock this data in the register 41.

If a reading operation were started when the clock controlling the register 41 is in the low state, the data to be read would be valid on the output port when the clock controlling the register 41 is in the high state, but would no longer be valid if this clock had a rising edge. It would thus not be possible to lock this data in the register 41.

A decoding circuit according to the invention may be utilized in an electronic device such as a mobile telephone. A decoding circuit according to the invention may thus be utilized in a communication network comprising at least a transmitter able to send coded signals, a transmission channel and a receiver able to receive said signals.

The invention also relates to a decoding method which may be used in an electronic circuit comprising a decoding circuit according to the invention. Such a decoding method comprises:

a first step in which the first decoder linearly reads extrinsic input data stored in a single memory comprising addresses, calculates extrinsic output data from each extrinsic input data and writes each extrinsic output data at the address containing the corresponding extrinsic input data;

a second step in which the second decoder reads in interleaved fashion the extrinsic input data stored in the single memory and corresponding to the extrinsic output data calculated by the first decoder during the first step, calculates extrinsic output data and writes each extrinsic output data at the address containing the corresponding extrinsic input data.

In principle it is possible to implement this decoding method by means of a suitably programmed integrated circuit. A set of instructions contained in a program memory may order the integrated circuit to carry out the various steps described previously. The set of instructions may be loaded in the program memory by reading a data carrier such as, for example, a disc on which the set of instructions is coded. Reading may be effected via a communication network such as, for example, the Internet. In that case a service provider will put the set of instructions at the disposal of interested parties.

The verb "to comprise" and its conjugations are to be interpreted broadly, that is to say as not excluding the presence of not only other elements than those listed after said verb, but a plurality of elements already listed after said verb and preceded by the article "a" or "an".

The invention claimed is:

1. A decoding circuit for decoding input data in iterative manner, said circuit comprising at least a first decoder and a second decoder, each decoder being able to calculate extrinsic output data from the input data and extrinsic input data coming from the other decoder, wherein said circuit comprises a single memory for storing the extrinsic data at certain addresses, the extrinsic output data calculated by a decoder from the extrinsic input data coming from the other decoder being stored at the address of the extrinsic input data, the first decoder reading the extrinsic input data in a first order from the single memory, the second decoder reading the extrinsic input data in a second order from the single memory, wherein the single memory is controlled by a frequency clock (CLK2$x$) that is two times faster than a frequency of a control clock (CLK) of the decoders, further comprising:

a register, being controlled by said control clock, for reading and temporarily storing a component of an extrinsic input data vector during a high state of a cycle of said control clock and writing to said first decoder and an interleaver during a low state of a cycle of said control clock;

the interleaver receiving the stored component from the register and providing the second decoder with the extrinsic input data in the second order.

2. The decoding circuit of claim 1, wherein the first order is a linear order and the second order is an interleaved order.

* * * * *